United States Patent

Jean et al.

[11] Patent Number: 5,886,591
[45] Date of Patent: Mar. 23, 1999

[54] DEVICE INCLUDING A PASSIVE COUPLER CIRCUIT PHASE SHIFTING THROUGH 180°

[75] Inventors: Patrick Jean, Orsay; Christophe Boyavalle, Brunoy, both of France

[73] Assignee: U.S. Philips Corporation, New York, N.Y.

[21] Appl. No.: 818,142

[22] Filed: Mar. 13, 1997

[30] Foreign Application Priority Data

Mar. 13, 1996 [FR] France ................................. 96 03154
Dec. 19, 1996 [FR] France ................................. 96 15666

[51] Int. Cl.$^6$ ................................. H03H 7/21; H01P 5/12
[52] U.S. Cl. ........................ 333/118; 333/25; 330/124 R
[58] Field of Search ........................... 333/4.5, 112, 110, 333/117, 118, 120, 124, 25; 330/124 R, 53

[56] References Cited

U.S. PATENT DOCUMENTS

| | | | |
|---|---|---|---|
| 3,723,913 | 3/1973 | Seidel | 333/112 |
| 4,992,761 | 2/1991 | Seely et al. | 333/118 |
| 5,023,576 | 6/1991 | Staundinger et al. | 333/118 |
| 5,028,880 | 7/1991 | Sakai | 333/120 X |
| 5,101,171 | 3/1992 | Redmond | 330/124 R |
| 5,124,674 | 6/1992 | Dydyk et al. | 333/110 |
| 5,175,517 | 12/1992 | Dydyk et al. | 333/118 |
| 5,189,434 | 2/1993 | Bell | 333/25 X |
| 5,481,231 | 1/1996 | Dydyk et al. | 333/118 X |

OTHER PUBLICATIONS

"Microwave Mixers, Second edition" by Stephen A. Maas, published by Artech House, Boston, London. Oct. 1992, pp. 237–269.

*Primary Examiner*—Seungsook Ham
*Attorney, Agent, or Firm*—Steven R. Biren

[57] ABSTRACT

A device includes a passive coupler circuit with lumped elements for coupling a first A.C. signal having a given center frequency (fo) present on a first primary port (P1) to two second A.C. signals phase shifted through 180° present on two secondary ports (P3, P4). The device has a first and a second elementary circuit (B, B') phase shifting through 180° respectively, a differential input terminal (1, 1') and a summation input terminal (2, 2') and first and second output terminals (3, 4; 3', 4'), elementary circuits being connected to each other so that the differential input terminal (1) of the first circuit (B) feeds first primary port (P1), the differential input terminal (1') of the second circuit (B') feeds a second primary port (P'1) connected to ground via an impedance (Zo), the output terminals (3, 4; 4', 3') of the first and second circuits (B, B') are coupled crosswise respectively, and feed said secondary ports (P3, P4), and the summation input terminals (2, 2') are short-circuited.

8 Claims, 6 Drawing Sheets

DEVICE INCLUDING A PASSIVE COUPLER CIRCUIT PHASE SHIFTING THROUGH 180°

BACKGROUND OF THE INVENTION

The invention relates to a device including a passive coupler circuit phase shifting through 180°.

The invention finds its application in the integrated circuit industry and, particularly, in the industry for monolithic microwave integrated circuits (MMIC).

A passive coupler circuit for microwave mixers is already known from a general teaching publication entitled "MICROWAVE MIXERS, Second edition" by Stephen A. MAAS, published by "Artech House, Boston, London".

This document describes on page 254 in connection with a FIG. 7.16a, a 180° coupler comprising four sections II and T which form transmission line elements for making the circuit equivalent to a structure described with reference to a FIG. 7.14. The sections II comprise an inductor between two grounded capacitors, and the section T comprises two series-arranged capacitors and one inductor connected to ground. The sections II form $\lambda/4$ lines and the sections T form $3\lambda/4$ lines.

SUMMARY OF THE INVENTION

It is an object of the present invention to provide a device comprising a passive coupler circuit with lumped elements for coupling at least a primary A.C. signal to two secondary A.C. signals shifted in phase through 180°.

It is an object of the invention to provide such a device which is compatible with the monolithic microwave integrated circuits and thus has a smaller surface and/or improved performance compared with the couplers known from the state of the art.

These problems are solved by a device including a passive coupler circuit with lumped elements, for coupling a first A.C. signal having a given center frequency present on a first primary port to two second A.C. signals phase shifted through 180° present on two secondary ports, comprising a first and a second elementary 180° phase shifter circuit having a differential input terminal and a summation input terminal, and corresponding first and second output terminals, said elementary circuits being connected to each other, so that the differential input terminal of the first circuit feeds said first primary port and the differential input terminal of the second circuit feeds a second primary port connected to ground via an impedance, in that the output terminals of the first and second circuits are coupled crosswise and feed said secondary ports, and in that the summation input terminals are short-circuited.

These and other aspects of the invention will be apparent from and elucidated with reference to the embodiments described hereinafter.

DESCRIPTION OF THE PREFERRED EMBODIMENTS

Hereafter, various passive coupler circuits with lumped elements will be described. Each passive coupler circuit effects a coupling between a first A.C. signal having a given center frequency fo present on a first primary port P1, and two second A.C. signals phase shifted through 180° present on two secondary ports P3, P4. According to the invention, a coupler circuit comprises a first and a second elementary circuit B, B' phase shifted through 180°, having lumped elements connected in a particular manner.

Figure 1A:
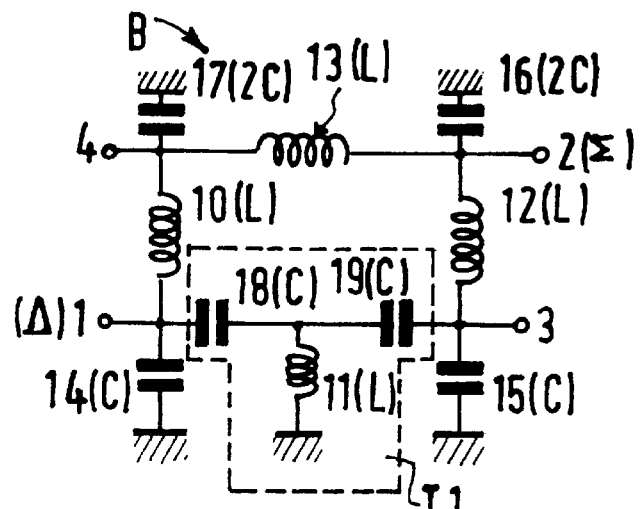
FIGS. 1A, 1B and 1C represent a first elementary 180° phase shifter circuit with lumped elements in various equivalent embodiments.
Figure 2A:
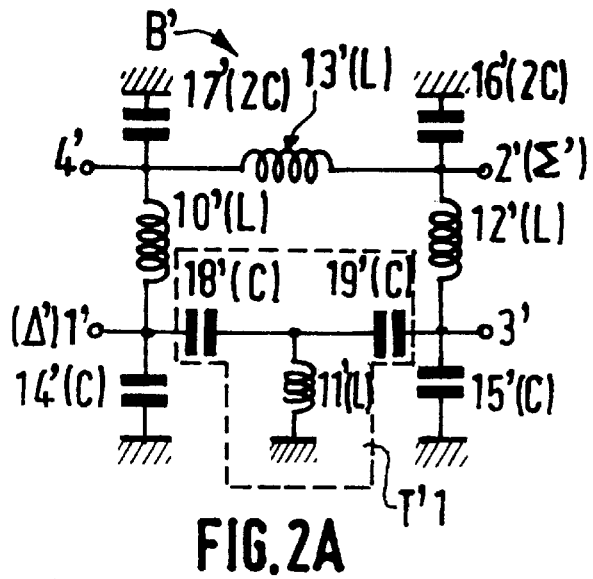
FIGS. 2A, 2B and 2C represent a corresponding second elementary phase shifter circuit.

As is represented by the respective diagrams of FIG. 1A and FIG. 2A, the elementary circuits B, B' have a first and a second input terminal 1, 2 and 1', 2' 2' respectively, and a first and a second output terminal 3, 4 and 3', 4' respectively, which are diametrically opposed to each other. The elementary circuits B, B' comprise an assembly of inductors having the inductance value N denoted 10, 13, 12 and 10', 13', 12' respectively, arranged between the terminals 1, 4, 2, 3 and 1', 4', 2', 3' respectively, and capacitors having capacitance value C denoted 14, 15 and 14', 15' respectively, connecting the terminals 1, 3 and 1', 3' to ground, and capacitors 16, 17 and 16', 17' having capacitance value 2C connecting the terminals 2, 4 and 2', 4' to ground. The product of the inductance L and capacitance C is linked with the center frequency fo by the relationship:

$$L\omega = 1/C\omega \text{ where } \omega = 2\pi fo.$$

Figure 3A:
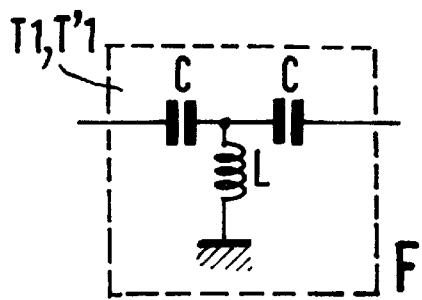
FIGS. 3A to 3D represent elementary cells of phase shifter circuits.

Between the respective terminals 1, 3 and 1', 3', the elementary circuits comprise cells T such as represented in FIG. 3A, denoted T1, T'1, formed by an inductor 11, 11' respectively, having inductance value L connected to ground and inserted between two capacitors 18, 19 and 18', 19'which have the capacitance value C which form, for example, $3\lambda/4$ cells where $\lambda$ is the wavelength associated with fo.

Figure 1B:
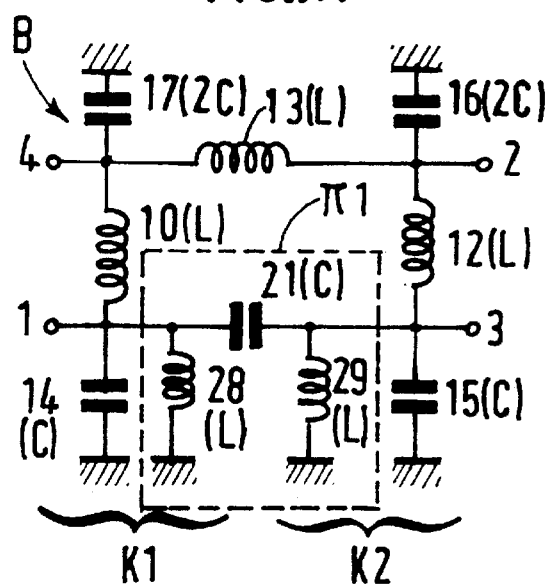
Figure 2B:
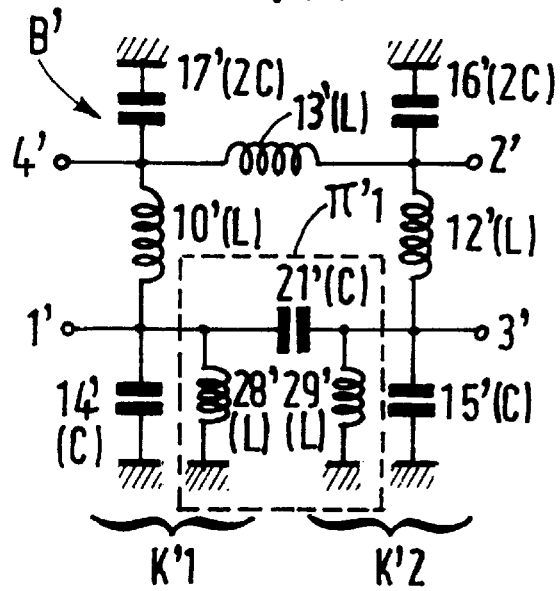
Figure 3B:
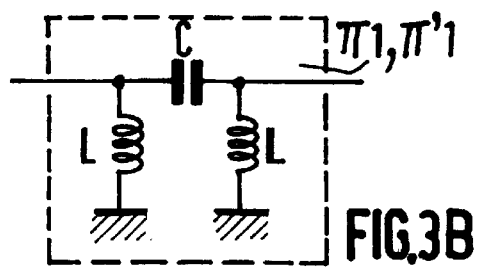

With reference to the FIGS. 1B and 2B, the diagrams of the elementary circuits B, B' are transformed by replacing the cells T1, T'1 by cells II as represented in FIG. 3B and denoted II1, II'1, formed by a capacitor 21, 21' respectively, having value C, inserted between two inductors 28, 29 and 28', 29' connected to ground forming, for example, $3\lambda/4$ cells.

The diagrams of elementary circuits B, B', comprising these cells II are simplified when taking into account that the inductors L and capacitors C connected in parallel to ground form L-C cells denoted K, such as the cells 28-14, 28'-14', 29-15 and 29'-15', which form the cells K1, K'1, K2 and K'2, respectively. These L-C cells are considered equivalent to open circuits having the center frequency fo, yielding the diagrams of elementary circuits B, B' represented in FIGS. 1C and 2C.

According to the invention, each pair of elementary circuits B, B' described previously can be used indifferently for forming a coupler according to the invention via an assembly particularly described hereafter. Transformations of cells T into cells II, and simplifications making L-C cells open circuits can be carried out in accordance with this particular assembly when these modifications have not been made before.

These passive elementary circuits B, B' having lumped elements form a family of phase shifters whose function is:

to produce between the first and second output terminals denoted 3, 3' and 4, 4' signals phase shifted through 180° when an A.C. signal is applied to their first input terminal, called differential terminal Δ, Δ' denoted 1, 1' here, and to apply a summed signal to their second input terminal called summation terminal Σ, Σ' denoted 2, 2' here, when in-phase signals are produced on their output terminals 3, 3' and 4, 4', respectively.

These properties are utilized for said particular assembly according to the invention.

Figure 1C:
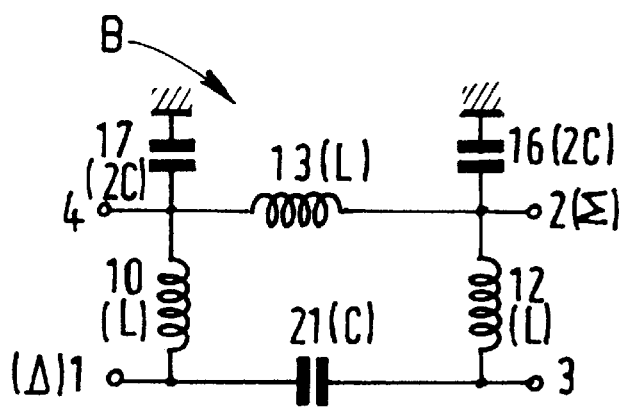
Figure 2C:
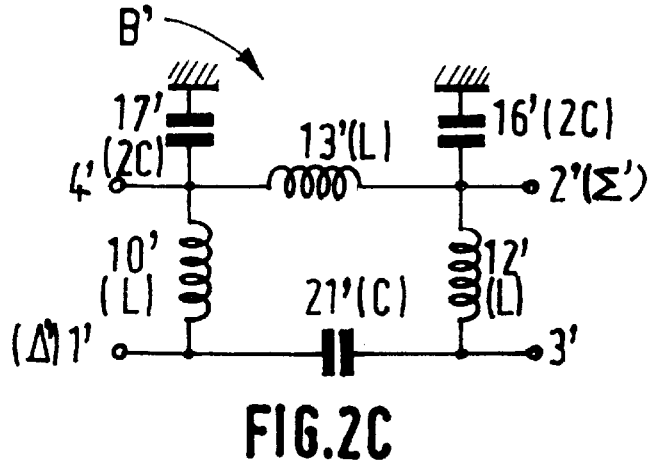
Figure 4A:
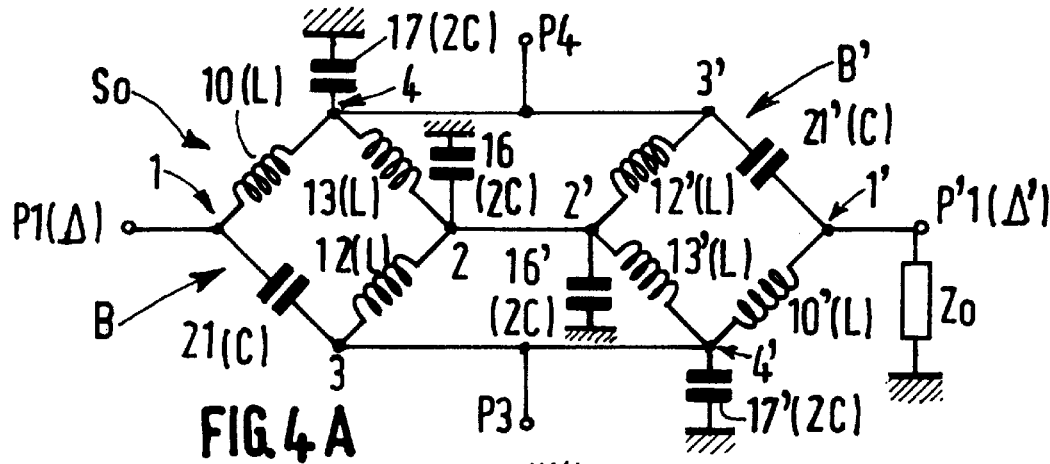
FIGS. 4A and 4B represent assembly plans of the first and second phase shifter circuits for the formation of a symmetrical coupler circuit phase shifting through 180°.

A first example relates to symmetrical coupling circuits derived from the particular assembly of the pair of simplified elementary circuits B, B' represented in FIGS. 1C and 2C. With reference to FIG. 4A, for forming a symmetrical coupler phase shifted through 180° denoted So, the elementary phase shifter circuits B, B' are connected so that the A.C. signal to be coupled is applied to the differential input terminal 1 of the first elementary circuit B which forms a first primary port P1; the first output terminals 3', 3 of the elementary circuits are connected crosswise to the second output terminals 4, 4' respectively, for forming a first and a second secondary port P4, P3; the summation input terminals 2 and 2' of the two elementary circuits are connected to each other; the differential input terminal 1' of the second elementary circuit B' forms a second primary port P'1 connected to ground via a linked impedance Zo which has the center frequency. For example, this impedance Zo is a resistor Ro linked by the relationship:

$$L\omega = 1/C\omega = 2\sqrt{2}Ro \text{ where, for example, } Ro = 50\Omega.$$

Figure 4B:
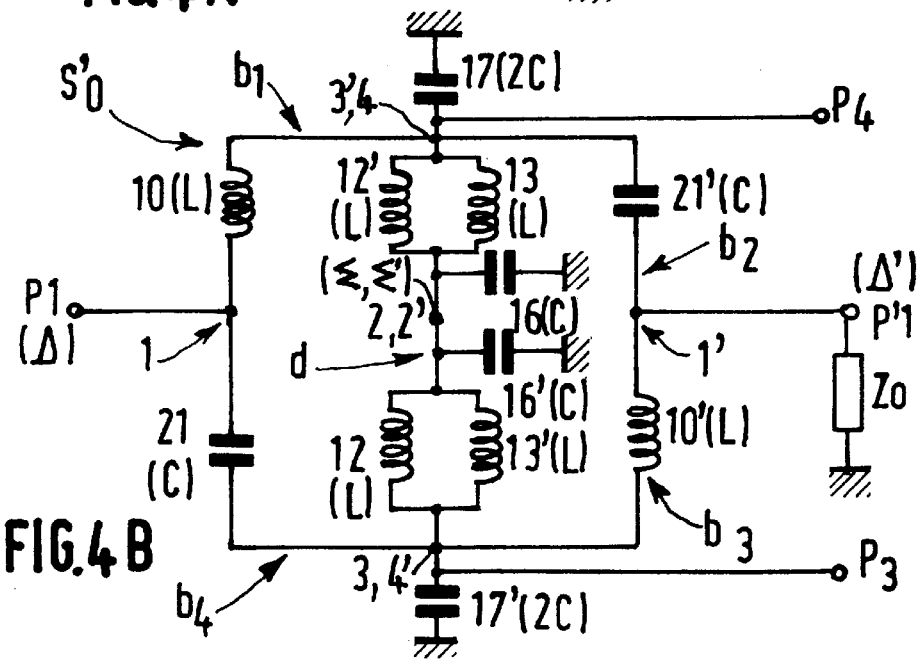

With reference to FIG. 4B, the circuit diagram So of FIG. 4A is simplified into a diagram S'o in which the inductors 12, 13' and 13, 12' having value L of the elementary phase shifter circuits B, B' are connected in parallel, and the capacitors 16, 16' having value 2C are connected in parallel. The first and second secondary ports P4, P3 are connected to ground through the respective capacitors 17 and 17' which have the value 2C. With reference to the FIGS. 5A to 5C, the simplified diagram S' of the coupler circuit of FIG. 4B results in two embodiments for symmetrical couplers according to the invention.

Figure 3C:
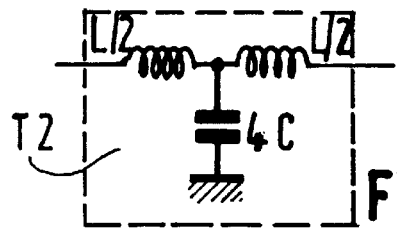
Figure 5A:
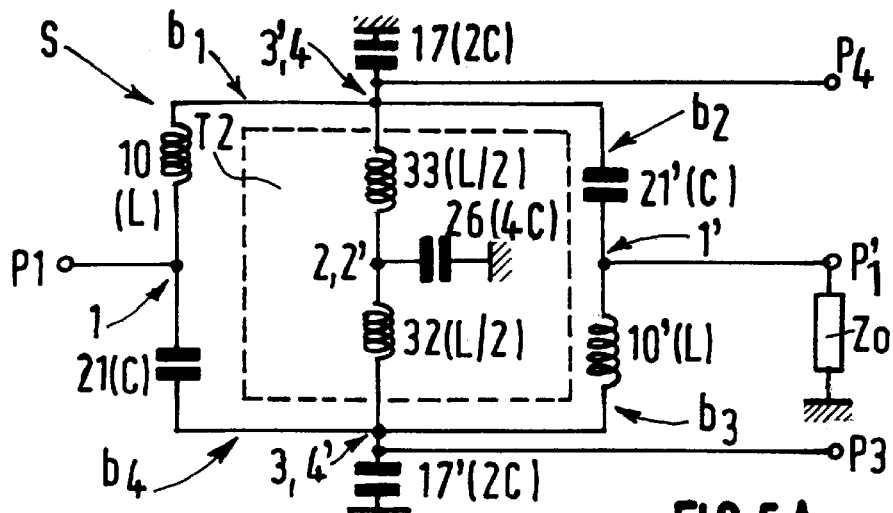
FIGS. 5A to 5C represent two exemplary embodiments of simplified symmetrical coupler circuits phase shifting through 180°.

With reference to FIG. 5A, in a first embodiment of a symmetrical coupler denoted S, the inductors 12, 13' and 13, 12' having value L of the elementary phase shifter circuits B, B' connected in parallel result in inductors 33, 32 having half the value, L/2, and the capacitors 16, 16' having value 2C connected in parallel result in a capacitor 26 having twice this value, 4C. The cell formed by the capacitor 26 having value 4C inserted between the inductors 32, 33 having value L/2 is an elementary T cell, for example, 3λ/4, denoted T2, such as represented in FIG. 3C.

Figure 3D:
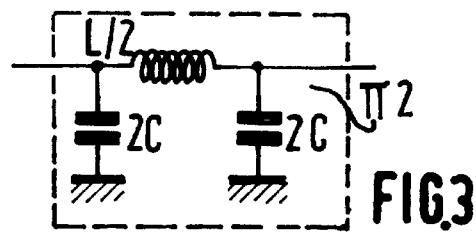
Figure 5B:
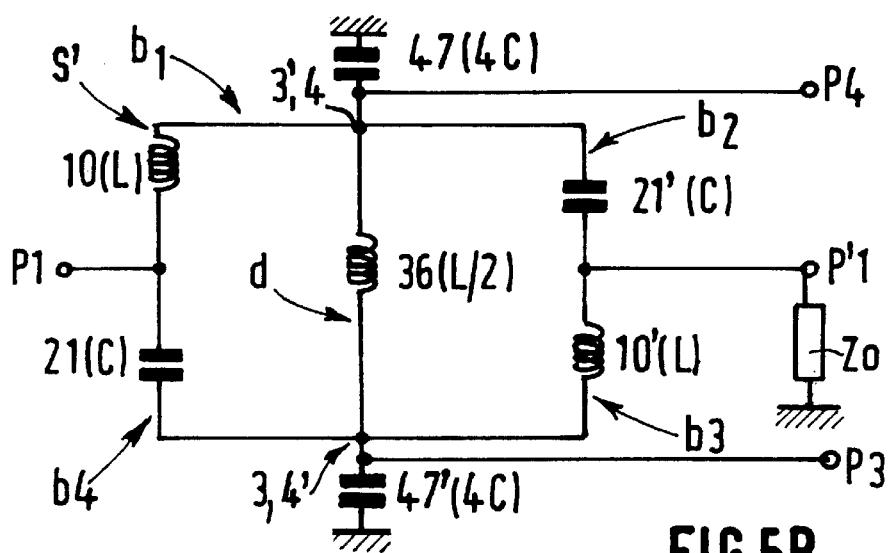
Figure 5C:
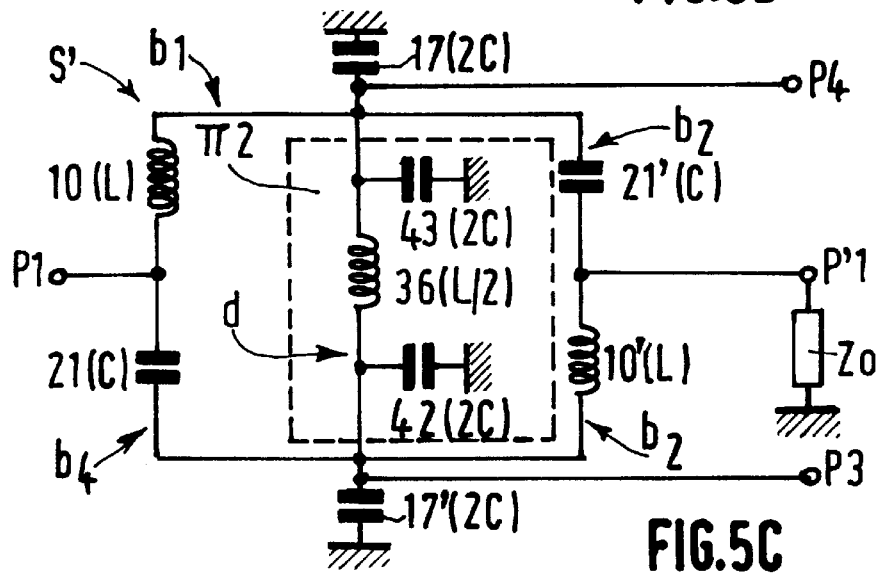

With reference to FIG. 5C, in a second embodiment of a symmetrical coupler denoted S', the cell T2 is replaced by an elementary cell II, denoted II2, for example 3λ/4, such as represented in FIG. 3D and formed by an inductor 36 having value L/2 inserted between two capacitors 43, 42 having value 2C.

Figure 8A:
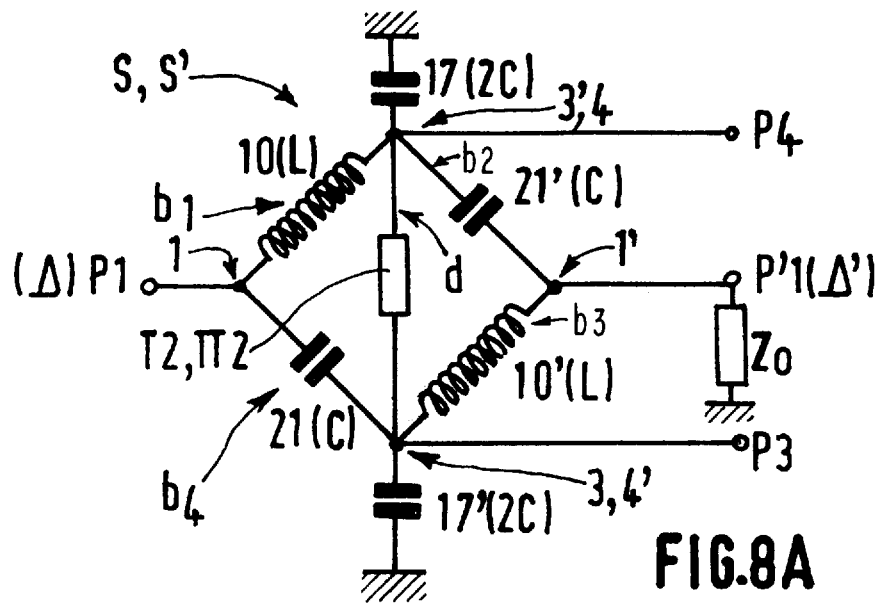
FIGS. 8A and 8B are equivalent diagrams of the preceding symmetrical and asymmetrical couplers, respectively.

The simplified couplers S and S' arranged in this manner and as represented by the diagram of FIG. 8A comprise four connected branches b1, b2, b3 and b4 forming a circular structure in which the primary and secondary ports P1, P'1 and P4, P3 respectively, are diametrically and symmetrically opposed to each other. The secondary ports P4, P3 are connected via a transversal branch d formed either by the elementary cell T2 or the elementary cell II2 and are furthermore connected to ground across the respective capacitors 17, 17' which have value 2C. The first primary port P1 is for the A.C. signal and the second primary port P'1 is connected to ground via the impedance Zo.

With reference to FIGS. 5A, 5B, the circular structure is formed of the branches b1, b2, b3 and b4 which comprise an alternation of inductors 10, 10' having value L in the opposite branches b1, b3 and capacitors 21, 21' having value C in the opposite branches b2, b4. The transversal branch d comprises cells T2 or II2 as already described. In the circuit S comprising the transversal branch d with T2, the secondary ports P4, P3 are connected to ground across the capacitors 17, 17' having value 2C, as shown in FIG. 5A. In the coupler circuit S' comprising the transversal branch d with II2, said branch d is reduced to the inductor 36 which has value L/2, and the secondary ports P4, P3 are connected to ground across the capacitors 47, 47' which have value 4C, by a regrouping of capacitors 43 and 42 coming from the transversal branch d for II, with the respective parallel capacitors 17, 17', as shown in FIG. 5B.

A second example relates to asymmetrical coupler circuits suitable for producing output signals phase shifted through 180°. These coupler circuits are derived from particular simplified arrangements of circuits S, S' of FIGS. 5A and 5B.

Figure 6:
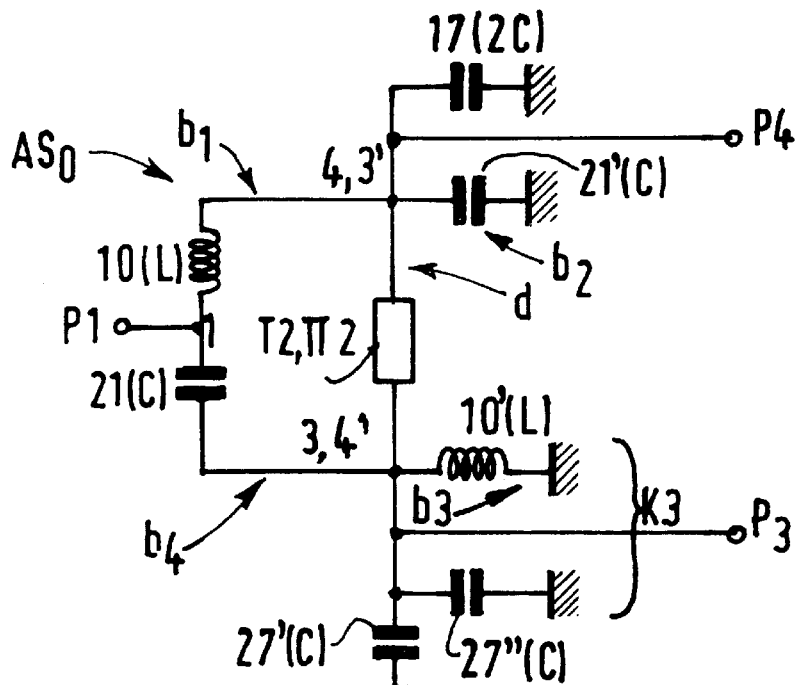
FIG. 6 represents an assembly plan for the formation of an asymmetrical coupler circuit phase shifting through 180°.

With reference to FIG. 6, the second primary port P'1 in the circuits S and S' is short-circuited to ground (Zo=0), resulting in an asymmetrical coupler circuit diagram ASo. The branch b2 is formed by the capacitor 21' having value C connected to ground and connected in parallel to the capacitor 17 having value 2C, and the branch b3 is formed by the inductor 10' having value L connected to ground. In this particular arrangement, the capacitor 17' having value 2C is split up into two parallel capacitors 27' and 27" each having value C. The capacitor 27" is coupled to the inductor 10' having value L to form a cell K3 which is considered an open circuit as has already been described, to form the diagrams of coupler circuits AS, AS'.

Figure 7A:
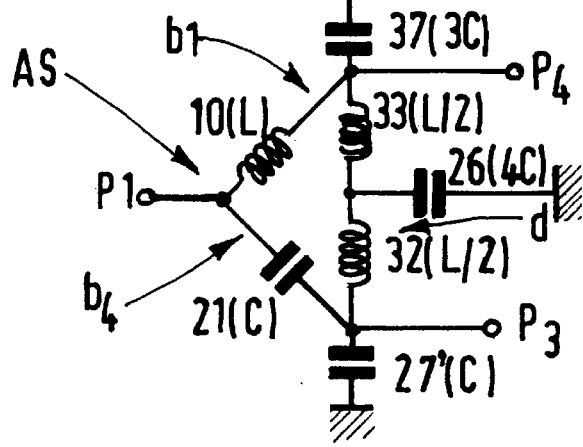
FIGS. 7A and 7B represent two exemplary embodiments of asymmetrical coupler circuits phase shifting through 180°.
Figure 7B:
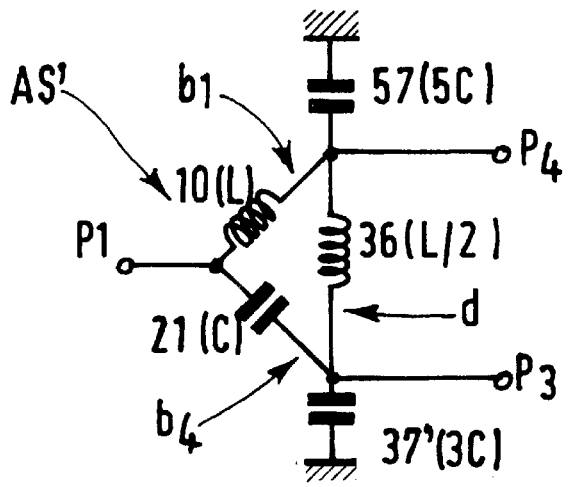
Figure 8B:
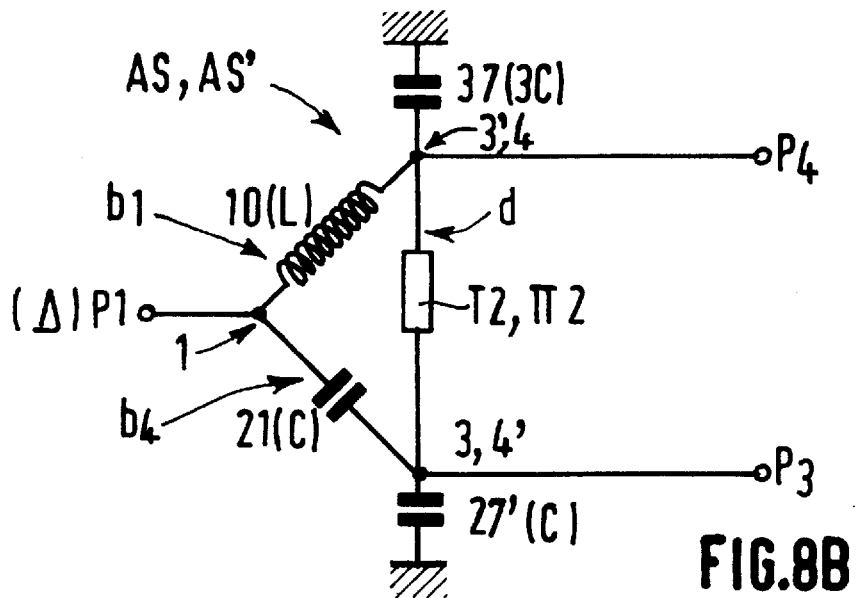

With reference to FIGS. 7A and 8B, in two embodiments, the asymmetrical coupler circuits AS and AS' comprise two branches b1, b4 which stretch from the single primary port P1 to the secondary ports P3, P4 and comprise an inductor 10 having value L and a capacitor 21 having value C. The secondary ports are connected by a transversal branch d as described in the first example. In the circuit AS, the secondary ports P4, P3 are connected to ground via the capacitor 37 having value 3C, regrouping the parallel capacitors 17, 21', and via the capacitor 27' having value C. In the circuit AS', the secondary ports are connected to ground via the capacitor 57 having value 5C, regrouping the parallel capacitors 17, 21', and 43 and by the capacitor 37' having value 3C regrouping the parallel capacitors 27' and 42.

When devices, for example, semiconductors, and particularly for telecommunication systems are manufactured, and include one of the coupling circuits according to the invention as proposed, for example, in FIGS. 5A, 5B and 8A, 8B, advantages are derived in that these circuits are compact, the inductors have low values, which accordingly reduces the losses, the number of ground points has diminished relative to the couplers known from the state of the art, which improves the performance in high and microwave frequencies, facilitates the connections and provides easier integration and greater reliability of these devices.

These coupler circuits are highly advantageous in frequency bands which are in the region of very high frequencies (from about 100 MHz to several GHz) or microwave frequencies (from about 1 GHz to 30 GHz). These coupler circuits such as S and S' are wideband coupler circuits. For example, the circuit S' of FIG. 5B could show a passband from 750 MHz to 1.1 GHz or also 24 GHz to 40 GHz.

The asymmetrical coupler circuits have losses theoretically reduced to zero because Zo=0. The symmetrical couplers are highly advantageous for offering further signals to double-balanced mixers which are useful in telecommunication systems.

Figure 9:
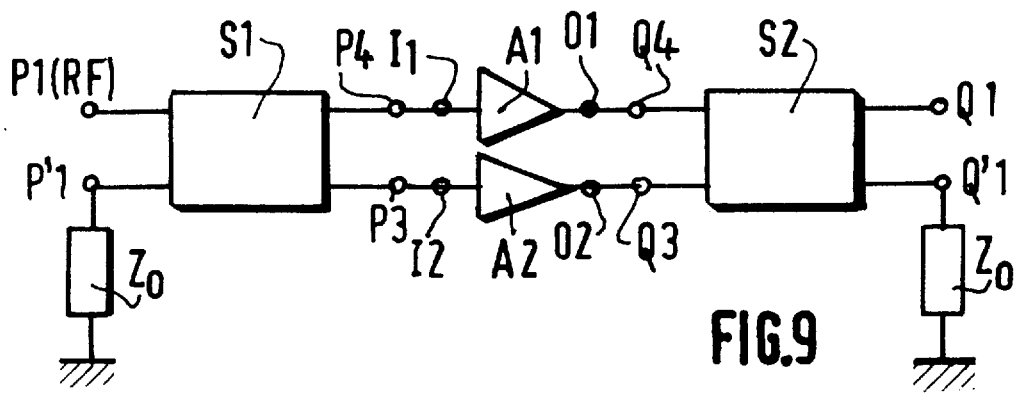
FIG. 9 represents a device of the balanced amplifier type including two of the preceding couplers.

With reference to FIG. 9, in a third example, a device comprises two couplers denoted S1, S2 of a type described in one of the preceding examples, linked with two amplifiers denoted A1, A2 of a type known by a person skilled in the art, for forming a balanced amplifier device which can be used in telecommunication systems, more particularly for radio frequency receivers. For example, a radio frequency signal RF is applied to the first primary port P1 of the coupler S1. The secondary ports P4, P3 are connected to the inputs I1, I2 of the two amplifiers A1, A2 whose outputs O1, O2 are connected to the secondary ports Q4, Q3 of the second coupler S2. The output of the balanced amplifier formed in this manner is available on the first differential port of the second coupler S2. The second primary ports P'1, Q'1 are connected to ground through an impedance Zo.

The circuits and devices described above are favorably realized in monolithic microwave integrated circuit (MMIC) technology.

What is claimed is:

1. Device including a passive coupler circuit with lumped elements, for coupling a first A.C. signal having a given center frequency (fo) present on a first primary port (P1) to two second A.C. signals phase shifted through 180° present on two secondary ports (P3, P4), comprising a first and a second elementary 180° phase shifter circuit (B, B'), each having a differential input terminal (1, 1') and a summation input terminal (2, 2'), and first and second output terminals (3, 4; 3', 4'), said elementary circuits being connected to each other, so that the differential input terminal (1) of the first circuit (B) feeds said first primary port (P1) and the differential input terminal (1') of the second circuit (B') feeds a second primary port (P'1) connected to ground via an impedance (Zo), the output terminals (3, 4; 4', 3') of the first and second circuits (B, B') are coupled crosswise and feed said secondary ports (P3, P4), and the summation input terminals (2, 2') are short-circuited.

2. A device as claimed in claim 1, in which in said coupler the first and second connected elementary phase shifter circuits are arranged in a circuit comprising four connected branches (b1, b2, b3, b4) forming a circular structure, with the primary and secondary ports respectively arranged diametrically opposite each other and symmetrically on said structure, and with a transversal branch (d) connecting the two secondary ports (P3, P4).

3. A device as claimed in claim 2, in which the connected branches (b1, b2, b3, b4) of the circular structure have alternating phase shifting cells and in which the transversal branch (d) is a phase shifting cell T or II.

4. A device as claimed in claim 3, in which in the circular structure the phase shifting cells of the connected branches are formed by alternating inductors of value L (b1, b3) and capacitors of value C (b2, b4) arranged symmetrically between the primary ports, in which device in the transversal branch (d) one of the following conditions pertains: the cell T (T2) is formed by a capacitor having value 4C connected to ground inserted between two inductors having the value L/2, and the cell II (II2) is formed by an inductor having the value L/2 inserted between two capacitors having value 2C connected to ground; and in which device the secondary ports are connected to ground across respective capacitors (17, 17') having value 2C, and where the product of said values L and C of the inductor and capacitor is linked with said center frequency (fo).

5. A device as claimed in claim 1, in which said coupler, the first and second connected phase shifter elementary circuits are arranged in an asymmetrical circuit short-circuiting said second primary port to ground via a zero impedance (Zo=0), and while regarding a cell L-C (K3) which results from this structure, as an open circuit.

6. A device as claimed in claim 5, in which said coupler comprises two branches (b1, b4) which stretch from the first primary port (P1) to the secondary ports (P3, P4) formed by an inductor having value L and a capacitor having value C respectively, and a transversal branch (d) stretching between the two secondary ports (P3, P4) formed by a cell T (T2) or II (II2).

7. A device as claimed in claim 6, in which the cell T in the transversal branch is formed by a capacitor having value 4C connected to ground inserted between two inductors having value L/2, or also the cell II (II2) is formed by an inductor L/2 between two capacitors having the value 2C connected to ground.

8. A device including a balanced amplifier circuit comprising two coupler circuits as claimed in claim 1 whose secondary ports are connected to, on the one hand, the inputs and, on the other hand, to the outputs of two amplifier circuits, the first primary ports forming an input and an output respectively, of the balanced amplifier.

* * * * *